United States Patent [19]

Nakano

[11] Patent Number: 5,250,092
[45] Date of Patent: Oct. 5, 1993

[54] EXHAUST APPARATUS FOR EPITAXIAL GROWTH SYSTEM

[75] Inventor: Tomoiku Nakano, Tokyo, Japan
[73] Assignee: NEC Corporation, Japan
[21] Appl. No.: 922,687
[22] Filed: Jul. 30, 1992
[30] Foreign Application Priority Data Aug. 22, 1991 [JP] Japan .................. 3-066644

[51] Int. Cl.$^5$ ............................................. B01D 53/04
[52] U.S. Cl. ............................... 96/136; 55/DIG. 46; 118/715
[58] Field of Search .................... 55/73, 195, 208, 389, 55/DIG. 46, 316, DIG. 30; 118/715, 722

[56] References Cited

U.S. PATENT DOCUMENTS

| | | | |
|---|---|---|---|
| 3,309,844 | 3/1967 | Hemstreet et al. | 55/208 X |
| 4,440,618 | 4/1984 | Suzuki et al. | 118/715 X |
| 4,608,063 | 8/1986 | Kurokawa . | |
| 4,655,800 | 4/1987 | Tsukada et al. | 55/195 |
| 4,936,877 | 6/1990 | Hultquist et al. | 55/208 X |

FOREIGN PATENT DOCUMENTS

| | | |
|---|---|---|
| 0196170 | 10/1986 | European Pat. Off. . |
| 58-182817 | 10/1983 | Japan . |
| 60-13071 | 1/1985 | Japan . |
| 63-297296 | 12/1988 | Japan . |
| 1-139125 | 5/1989 | Japan . |
| 63-224214 | 9/1989 | Japan . |
| 663549 | 12/1987 | Switzerland . |

OTHER PUBLICATIONS

Patent Abstracts of Japan, vol. 8, No. 21 (E-224)(1458) Jan. 28, 1984.
Patent Abstracts of Japan, vol. 9, No. 125 (C-283)(1848) May 30, 1985.
Patent Abstracts of Japan, vol. 8, No. 21 (E-224) Apr. 21, 1982.
Patent Abstracts of Japan, vol. 13, No. 394 (C-631)(3742) Aug. 31, 1989.
Patent Abstracts of Japan, vol. 13, No. 134 (C-581)(3482) Apr, 4, 1989.
Patent Abstracts of Japan, vol. 13, No. 18 (E-704) Jan. 17, 1989.

Primary Examiner—Charles Hart
Attorney, Agent, or Firm—Laff, Whitesel, Conte & Saret

[57] ABSTRACT

An exhaust apparatus for an epitaxial growth system includes an exhaust pipe, a dust filter, and a liquid nitrogen trap. The exhaust pipe performs exhaustion of a reaction furnace in which a reaction gas is supplied to grow a thin film on a semiconductor wafer. The dust filter traps reaction products which have not been used for growing the thin film on the semiconductor wafer, and the dust filter is arranged in the exhaust pipe. The liquid nitrogen trap is arranged in the exhaust pipe in series with the dust filter.

5 Claims, 2 Drawing Sheets

EXHAUST APPARATUS FOR EPITAXIAL GROWTH SYSTEM

BACKGROUND OF THE INVENTION

The present invention relates to an epitaxial growth system used in the steps in manufacturing a semiconductor device and, more particularly, to an exhaust apparatus.

In a conventional epitaxial growth system, reaction gases such as $AsH_3$ (arsine), $PH_3$ (phosphine), $SiH_4$ (silane), and $H_2$ (hydrogen) are supplied to a reaction furnace, and a semiconductor wafer (to be referred to as a wafer hereinafter) is heated by induction heating or resistive heating to thermally decompose the supplied gases, thereby growing a thin film having a predetermined composition on the wafer. Products and non-reacted gases which are not used for growing the thin film on the wafer are exhausted from the reaction furnace through an exhaust pipe.

In order to trap the products or the like in the exhaust pipe, the exhaust pipe has a dust filter consisting of a metal mesh, a Teflon filter, or the like.

In the conventional exhaust apparatus of the epitaxial growth system, small reaction product particles and non-reacted gases are not sufficiently trapped. For this reason, these products flow in a rotary pump arranged near the distal end of the exhaust pipe to degrade exhausting ability. In addition, arsenic or phosphorus flows into the rotary pump, problems in maintenance or safety are posed. For example, when phosphorus is mixed with oil of the rotary pump, the oil is burnt in the air. Furthermore, when reaction products adhere to the inner portion of a pressure adjusting valve arranged near the distal end of the exhaust pipe, a degree of opening/closing the valve is changed during a pressure adjusting operation to degrade pressure control accuracy. When the size of the mesh in the dust filter is decreased (50 $\mu$m or less) to trap small reaction product particles, the exhausting ability is degraded.

SUMMARY OF THE INVENTION

It is an object of the present invention to provide an exhaust apparatus for an epitaxial growth system capable of sufficiently trapping small reaction product particles and non-reacted gases.

It is another object of the present invention to provide an exhaust apparatus for an epitaxial growth system designed to improve maintenance workability and safety.

It is still another object of the present invention to provide an exhaust apparatus for an epitaxial growth system for preventing pressure control accuracy from degradation caused by allowing reaction products to adhere to a pressure adjusting valve.

In order to achieve the above objects, according to the present invention, there is provided an exhaust apparatus for an epitaxial growth system, comprising an exhaust pipe for performing exhaustion of a reaction furnace in which a reaction gas is supplied to grow a thin film on a semiconductor wafer, a dust filter, arranged in the exhaust pipe, for trapping reaction products which have not been used for growing the thin film on the semiconductor wafer, and a liquid nitrogen trap arranged in the exhaust pipe in series with the dust filter.

DESCRIPTION OF THE PREFERRED EMBODIMENTS

Figure 1:
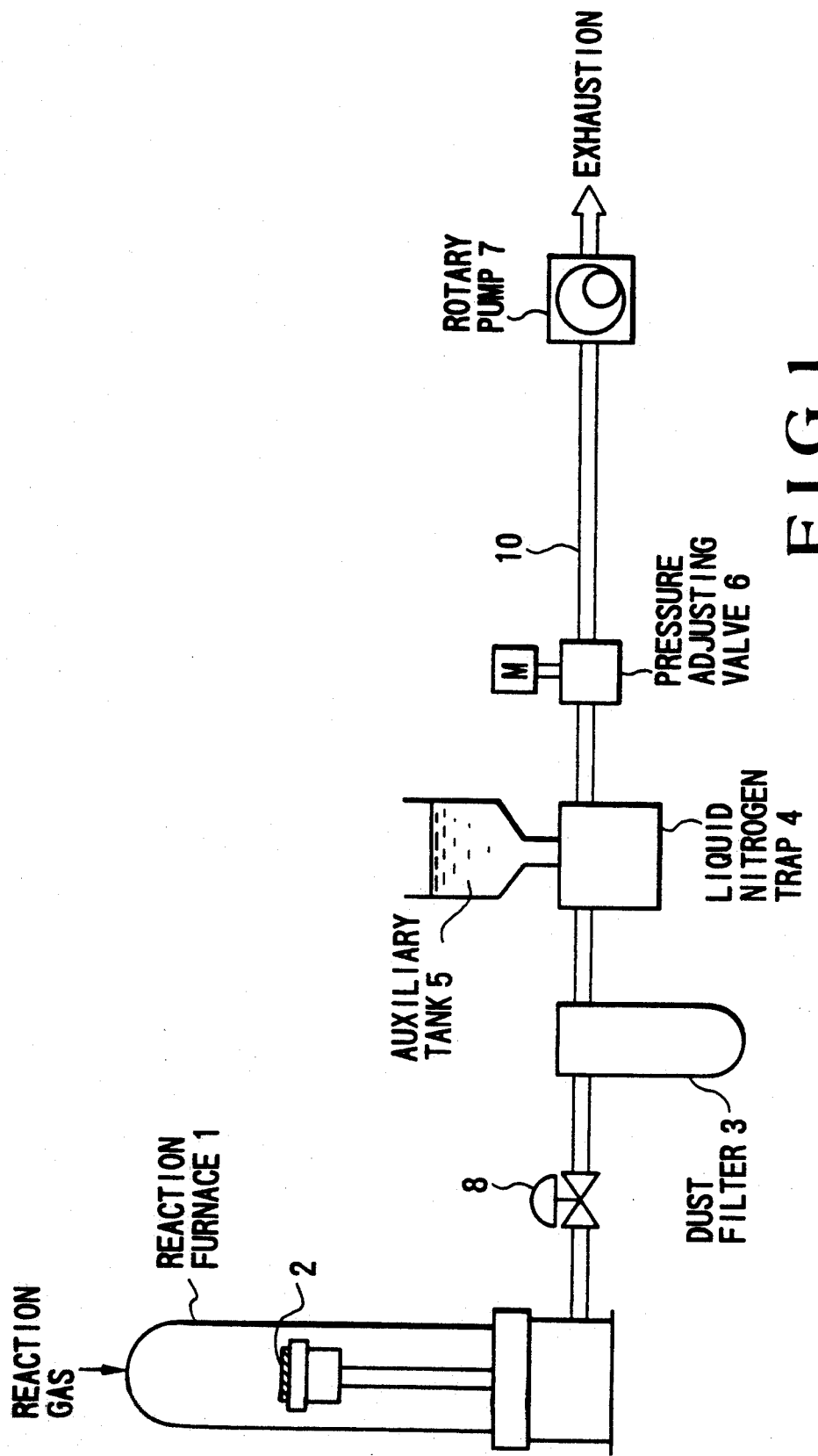
FIG. 1 is a view showing an arrangement of an exhaust apparatus for an epitaxial growth system according to the first embodiment of the present invention.

The present invention will be described below with reference to the accompanying drawings. FIG. 1 shows an arrangement of an exhaust apparatus for an epitaxial growth system according to the first embodiment of the present invention.

An exhaust pipe 10 for exhausting reaction products or the like is connected to a reaction furnace 1 to which a reaction gas is supplied. A wafer 2 is loaded in the furnace 1. A control valve 8 for controlling exhaustion, a dust filter 3 for trapping reaction products, a liquid nitrogen trap 4, having an auxiliary tank 5, for trapping a non-reacted gas, a pressure adjusting valve 6 for adjusting a pressure of the reaction furnace 1, and a rotary pump 7 for performing exhaustion are sequentially arranged midway along the exhaust pipe 10 from the reaction furnace side.

The reaction gas supplied to the reaction furnace 1 is thermally decomposed in the reaction furnace 1 to grow a thin film on the wafer 2. Reaction products which have not been used for growing the thin film on the wafer 2 flow in the exhaust pipe 10 except for reaction products adhering to the inner portion of the reaction furnace 1. Most of the reaction products flowing in the exhaust pipe 10 are trapped by the dust filter 3. However, reaction products having small particle sizes pass through a metal mesh (mesh: 50 to 100 $\mu$m) or the like in the dust filter 3. For this reason, the reaction products are adsorbed by a molecular sieve in the liquid nitrogen trap 4.

The reaction gas which has not been reacted in the reaction furnace 1 directly flows into the exhaust pipe 10. This non-reacted gas is not trapped by the dust filter 3, but adsorbed by the liquid nitrogen trap 4 serving as a sorption pump.

For this reason, the non-reacted gas does hot flow into the pressure adjusting valve 6 and the rotary pump 7, and the reaction products do not adhere thereto, thereby obtaining a stable exhausting operation.

At this time, the liquid nitrogen trap 4 has the auxiliary tank 5 so as to be always cooled, and liquid nitrogen is always supplied to the auxiliary tank 5. That is, a molecular sieve is arranged inside the liquid nitrogen trap 4 to be cooled by liquid nitrogen (boiling point: $-195.8°$ C.), such that non-reacted $PH_3$ (boiling point: $-87.7°$ C.; melting point: $-133°$ C.) or $AsH_3$ (boiling point: $-54.8°$ C.; melting point: $-113.5°$ C.) can be trapped. After a thin film was actually grown by flowing $AsH_3$ or $PH_3$, the dust filter and the liquid nitrogen trap are observed for maintenance. At this time, powder-like black or brown dust particles are found in the dust filter 3, and the surface of the molecular sieve in the liquid nitrogen trap 4 is burnt with a flame in the air because a large amount of phosphorus is assumed to be trapped. In addition, when phosphorus and arsenic contained in oil in the rotary pump are analyzed, almost no phosphorus and arsenic are contained in the oil.

Figure 2:
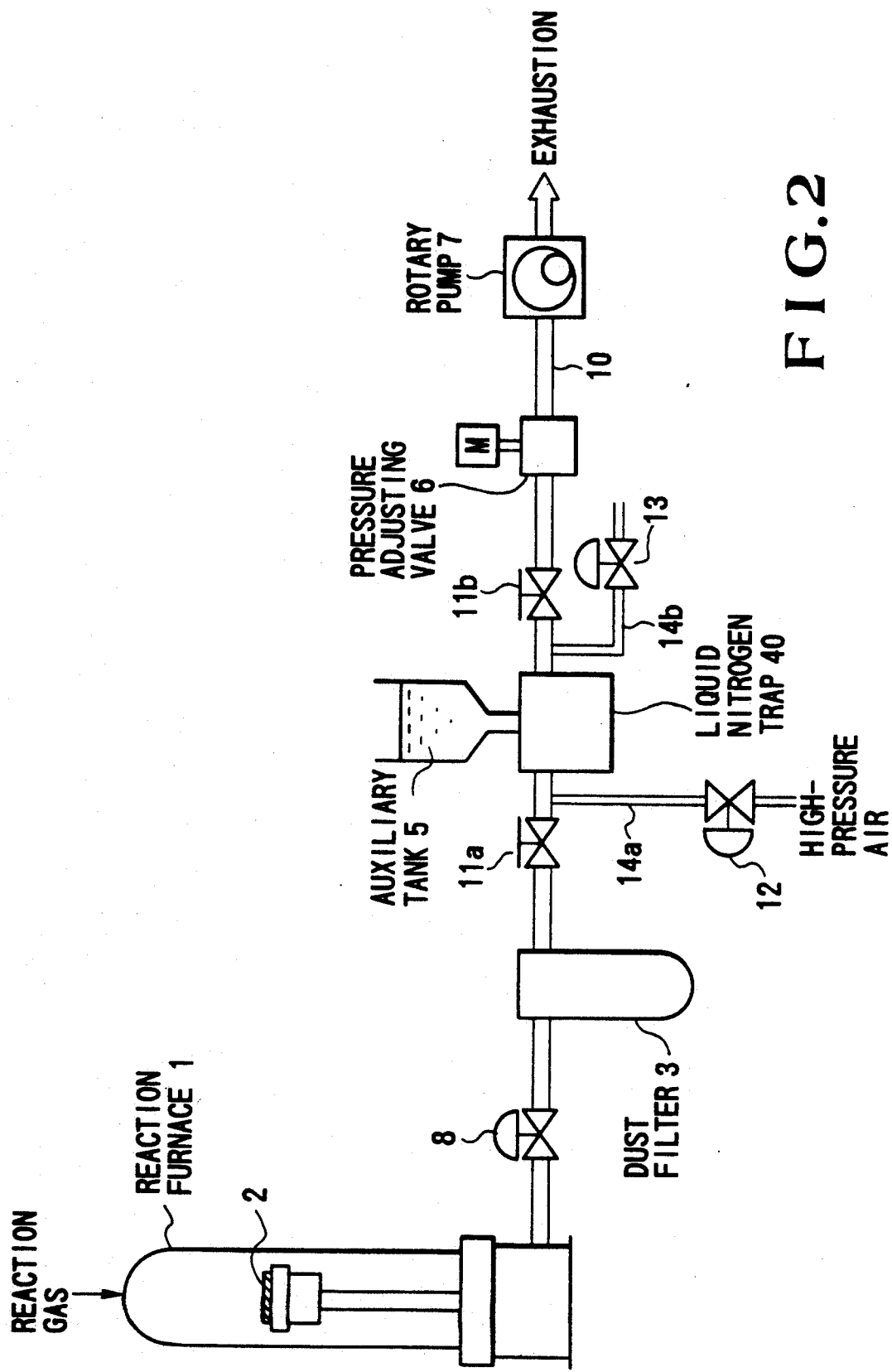
FIG. 2 is a view showing an arrangement of an exhaust apparatus for an epitaxial growth system according to the second embodiment of the present invention.

FIG. 2 shows an arrangement of an exhaust apparatus for an epitaxial growth system according to the second embodiment of the present invention. In this arrangement, a high-pressure air line for switching exhausting systems is connected to a liquid nitrogen trap 40.

The arrangements of FIGS. 1 and 2 are different from each other in the following points. That is, in FIG. 2, a pair of stop valves 11a and 11b are arranged in an exhausting pipe 10 on the inlet and outlet sides of a liquid nitrogen trap 40. High-pressure air pipes 14a and 14b are connected to the exhaust pipe 10 on the inlet and outlet sides of the liquid nitrogen trap 40, and the high-pressure air pipes 14a and 14b have an air valve 12 and an exhaust valve 13, respectively. A high-pressure air line consists of the air valve 12, the high-pressure air pipe 14a, the liquid nitrogen trap 40, the high-pressure air pipe 14b, and the exhaust valve 13.

Since the liquid nitrogen trap 40 has the high-pressure air line, non-reacted gases and small reaction product particles which are not decomposed in a reaction furnace 1 are trapped. Therefore, maintenance workability of the liquid nitrogen trap 40 can be improved.

That is, according to the second embodiment, the products and non-reacted gases are concentratedly trapped by the liquid nitrogen trap 40. For this reason, an efficient and safe maintenance operation can be performed as follows. The gases and products trapped by the liquid nitrogen trap 40 are isolated from another system by closing the stop valves 11a and 11b, and the air valve and the exhaust valve 13 are opened to supply high-pressure air into the liquid nitrogen trap 40. In this manner, the gas and products are mixed and reacted with the air in the closed system. Especially, when phosphorus is trapped, the phosphorus is actively reacted with water or oxygen and burnt. Therefore, the present invention can be effectively applied.

As described above, according to the present invention, since a dust filter and a liquid nitrogen trap are arranged in an exhaust pipe of an epitaxial growth system, reaction products and non-reacted gases can be effectively trapped, and the exhausting ability can be improved from several Torr to about 0.1 Torr. In addition, a growing pressure can be increased from ±5 Torr to ±2 Torr. Although maintenance of a conventional exhaust system requires three or four days, maintenance of the exhausting apparatus according to the present invention requires only one or two days.

What is claimed is:

1. An exhaust apparatus for an epitaxial growth system, comprising:
    an exhaust pipe for performing exhaustion of a reaction furnace in which a reaction gas is supplied to grow a thin film on a semiconductor wafer;
    a dust filter, arranged in said exhaust pipe, for trapping reaction products which have not been used for growing the thin film on said semiconductor wafer; and
    a liquid nitrogen trap arranged in said exhaust pipe in series with said dust filter.

2. A system according to claim 1, wherein said dust filter and said liquid nitrogen trap are sequentially arranged in said exhaust pipe from a reaction furnace side in an order named.

3. An exhaust apparatus for an epitaxial growth system, comprising:
    an exhaust pipe for exhausting a reaction furnace in which a reaction gas is supplied to grow a thin film on a semiconductor wafer;
    a dust filter, arranged in said exhaust pipe, for trapping reaction products which have not been used for growing the thin film on said semiconductor wafer;
    a liquid nitrogen trap arranged in said exhaust pipe in series with said dust filter; and
    a pair of stop valves arranged in said exhaust pipe on inlet and outlet sides of said liquid nitrogen trap, and a high-pressure air line for supplying high-pressure air to said liquid nitrogen trap when said stop valves are closed.

4. A system according to claim 3, wherein said high-pressure air line comprises a pair of high-pressure air pipes connected to the inlet and outlet sides of said liquid nitrogen trap and an air valve and an exhaust valve, respectively arranged in said high-pressure air pipes, for controlling circulation of high-pressure air in said liquid nitrogen trap.

5. A system according to claim 1, wherein said exhaust pipe has a pressure adjusting valve for adjusting a pressure in said reaction furnace and an exhaust pump for performing exhaustion.

* * * * *